July 21, 1970 A. J. BOWKER 3,521,184

FAIL-SAFE METAL DETECTOR REMOTELY POWERED AND MONITORED THROUGH A CABLE

Filed March 22, 1968

INVENTOR.

BY ANTHONY J. BOWKER

United States Patent Office 3,521,184

Patented July 21, 1970

3,521,184

FAIL-SAFE METAL DETECTOR REMOTELY POWERED AND MONITORED THROUGH A CABLE

Anthony J. Bowker, Victor, N.Y., assignor to Square D Company, Park Ridge, Ill., a corporation of Michigan Filed Mar. 22, 1968, Ser. No. 715,363
Claims priority, application Great Britain, Mar. 23, 1967, 13,864/67
Int. Cl. G01v *3/10;* H03b *5/08*
U.S. Cl. 331—65 8 Claims

ABSTRACT OF THE DISCLOSURE

A metal-sensing oscillator and a DC–DC converter are fed from a source having one lead at a potential of one polarity and the other lead at a common or zero potential. Signals from the oscillator and the converter are fed to an output circuit comprising a bistable multivibrator. Output signal appear selectively at one or the other of two terminals of the output circuit and are at a polarity opposite that of the given potential.

This invention relates to proximity detectors, and more particularly to a proximity detector for detecting the presence or absence of electrically-conductive objects in which the output signals rise to the supply voltage upon breakage of any supply lead wire.

Proximity detectors or switches are devices in which the output state is determined by the presence or absence of electrically-conductive material proximate to a sensitive head of the device. They may have the sensing head and control circuitry contained within a single unit or the sensing head and the control circuitry may be in separate units.

The earliest proximity detectors were for use with electromagnetic relay logic control systems and thus had relay outputs. This resulted in the early detectors being of the two unit designs. As static semiconductor logic systems became available, modified proximity detectors followed the design of the earlier relay logic detectors, but were arranged to provide suitable static output signals. One common detector of the static logic type employs a small sensing head consisting of a coil surrounded by a cup-type ferrite core. The coil is connected to the control or output unit by a multi-core screened cable of limited length. At the control unit, the cable is connected into a low power oscillator circuit which stops oscillating when metal is wtihin the vicinity of the coil. Two disadvantages of this prior detector are that the lead length is limited and breakage of any of the signal leads joining the control unit to the sensing head results in false outputs.

More recently, proximity detectors have become available which are completely self-contained, provide output signals suitable for use with semiconductor logic, and are capable of having the leads extended for considerable distances. These newer detectors can be arranged to fail-to-safety in the event of signal lead breakage, but if the breakage of the supply leads is considered, then none can be considered completely "fail-safe" because breakage of the common lead invariably causes both outputs to become energized so as to produce false outputs.

An object of this invention is to provide an improved proximity detector.

Another object is to provide an improved proximity detector which will fail-to-safety in event of breakage of any one of the supply leads.

A more detailed object is to provide an improved proximity detector including a DC–DC converter which functions to cause the output signal to be at opposite polarity with respect to a common lead from the polarity of one of the input leads.

A proximity detector in accordance with this invention comprises two input terminals connectable to a source of unidirectional potential, one side of which has a given potential of one polarity and the other of which has a common or zero potential, an output circuit having two output terminals, a sensing means for sensing the absence or presence of an electrically-conductive object proximate to the sensing means, a detector, and a DC–DC converter. The sensing means when connected across the two sides of the source supplies a voltage signal to the output circuit through the detector. The converter is also connected across the two input terminals and provides a voltage signal to the output circuit at opposite polarity to the given potential. The output circuit responds to the voltage signals to provide output signals of opposite polarity to the given potential at the two output terminals.

Further objects and advantages will become apparent from the following description wherein reference is made to the drawings, in which.

Figures 1, 2, 3, 4:
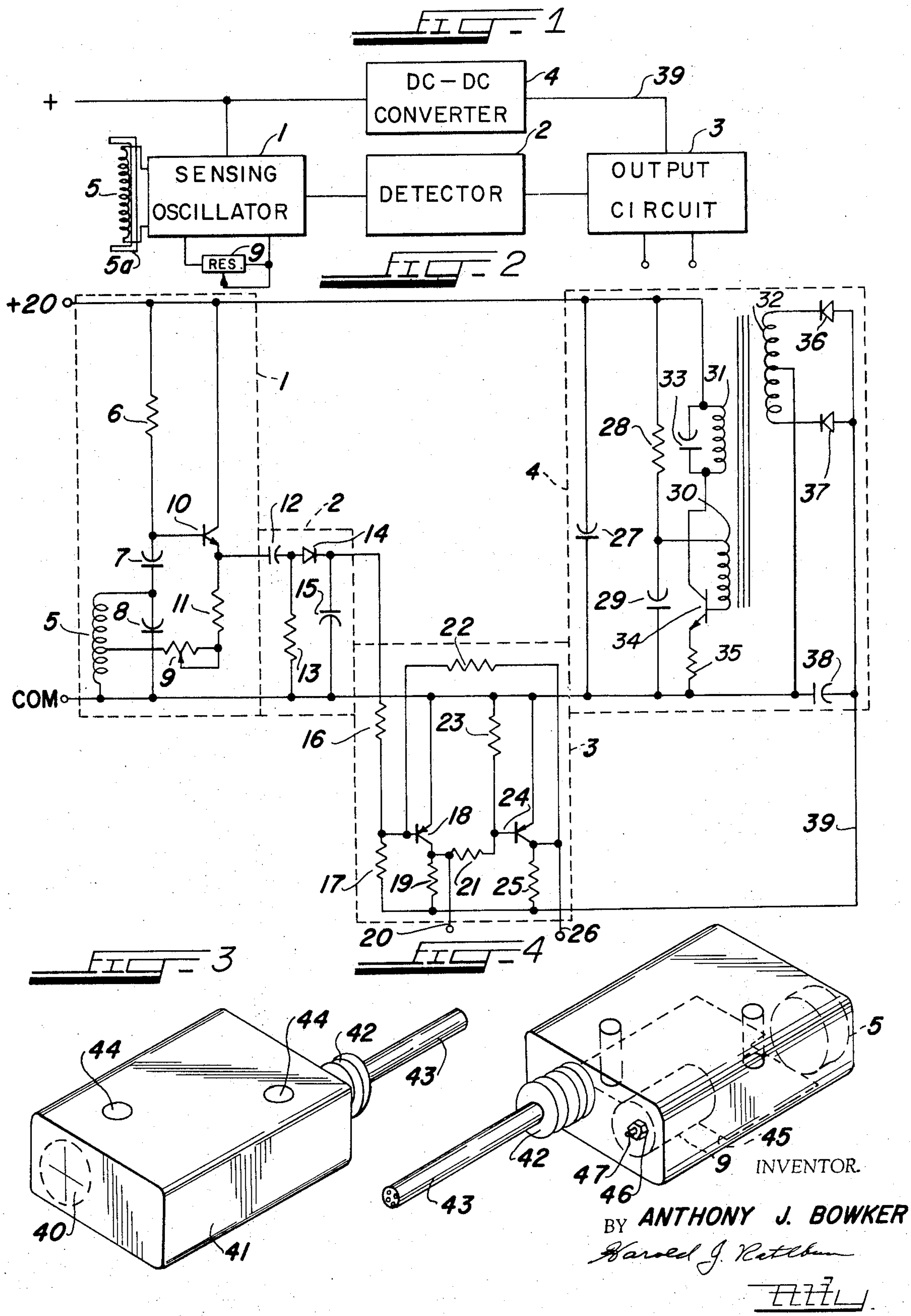
FIG. 1 is a block diagram of a proximity detector according to the present invention.
FIG. 2 is a detailed circuit diagram of the blocks shown in FIG. 1.
FIG. 3 is an external view of a proximity detector.
FIG. 4 is a further view of a proximity detector showing the general layout of the major parts thereof.

Referring now to FIG. 1, a sensing coil 5 having an iron core **5*a* is powered by a conventional low-power high-frequency sensing oscillator 1. The oscillator 1 is supplied from a supply source, indicated in FIG. 1 as a positive supply lead, and in turn feeds a detector 2. The signal from the detector 2 controls an output circuit 3 which is supplied by a DC–DC converter 4. The converter 4 is supplied from the same source that supplies the oscillator 1**.

Referring now to FIG. 2, four blocks indicated by broken lines and corresponding to the blocks of FIG. 1, are shown with circuit details included. A common lead is marked COM and a supply lead is marked +20.

The oscillator 1 comprises a transistor amplifier and an L-C parallel tuned oscillating tank circuit. The L-C tank circuit includes the coil 5 connected in parallel with a capacitor 8. The oscillating frequency of the tank circuit is determined by the inductive reactance of the coil 5 and the capacitive reactance of the capacitor 8. The power of the tank circuit is determined by an adjustable feedback voltage from the amplifier fed to the tank circuit through an adjustable resistor 9 and a fixed resistor 11 interposed between the emitter of an n-p-n transistor 10 and an intermediate tap on the coil 5. The output signal of the oscillator 1 is taken at the emitter of the transistor 10. The A-C output of the tank circuit is fed for amplification to the base of the transistor 10 through a capacitor 7 providing D-C isolation for the tuned circuit of the oscillator 1. D-C operating bias current for the transistor 10 is supplied from the positive supply through a resistor 6. The collector of the transistor 10 is connected directly to the supply lead +20. The coil 5 produces a magnetic field which senses by distortion thereof the penetration of an electrically-conductive object into the field. When the object to be detected is within the magnetic field of the coil 5, the reactance of the coil changes and the amplitude of the oscillations of the oscillator is thereby reduced. This reduction is detected by the detector 2.

The detector 2 rectifies and smooths the output of the oscillator 1 to develop a positive unidirectional voltage or output signal that varies from a maximum signal when no object is near the coil 5 to a lesser signal when an object is proximate to the coil 5. The detector 2 has four components, namely, a D–C isolating capacitor 12, a D-C restoring resistor 13, a diode 14 and a capacitor 15. The capacitor 12 is connected in series with the output of the oscillator 1. The resistor 13, the diode 14 and the capacitor 15 are connected in a pi-network having two leg branches and a bridge portion, the resistor 13 being connected in one leg branch, the diode 14 being connected in the bridge portion, and the capacitor 15 being connected in the other leg branch. The unidirectional voltage that is provided by the diode is smoothed by the capacitor 15 and the resultant output signal that is developed across the capacitor 15 is reduced toward or to zero when an object is moved within the detecting range of the coil 5 because of the diminution of the oscillations as noted above.

The output circuit 3 comprises a transistorized bistable multivibrator having two stable states of operation and two output signals, one stable state with a p-n-p transistor 18 non-conducting and a p-n-p transistor 24 conducting and another stable state with the transistor 18 conducting and the transistor 24 non-conducting. The one stable state is indicative of the absence of an object within the magnetic field of the coil 5 and produces an output signal at the output terminal 26. The other stable state is indicative of the presence of an object and produces an output signal at the output terminal 20. The output circuit 3 assures that only an output terminal or lead 20 or an output terminal or lead 26 is energized at one time. The output signal from the detector 2 is fed through a resistor 16 of the output circuit 3, and when this signal is present, the transistor 18 is held off against a bias provided by a resistor 17 connected between the base of the transistor 18 and the DC–DC converter 4. A resistor 19 serves as the collector load for the transistor 18 and provides an output voltage on the lead 20 which voltage also controls the transistor 24. A resistor 21 connected in series between the collector of the transistor 18 and the base of the transistor 24 provides forward bias for the transistor 24. A resistor 23 provides reverse bias for the transistor 24. The collector load for the transistor 24 is provided by a resistor 25 which also provides the output voltage on the lead 26, the resistor 25, like the resistors 17 and 19 being connected to the DC–DC converter 4 through a lead 39. A feedback from the output of the transistor 24 is carried through a resistor 22 to the base of the transistor 18 and ensures that only one of the leads 20 and 26 can be energized at one time. This feedback also ensures a certain hysteresis in the operation of the output circuit 3.

The polarity-reversing DC–DC converter 4 converts the positive supply voltage into a negative supply voltage by utilizing essentially a transistor oscillator with the alternating cycles rectified by a full-wave diode rectifier. The oscillator includes an L-C parallel-tuned tank circuit in the collector circuit of the transistor amplifier. The tuned circuit comprises a capacitor 33 and a coil 31 and determines the oscillating frequency of the oscillator. An n-p-n transistor 34 receives regenerative feedback from the tuned circuit by means of a winding 30, and the oscillator circuit develops its alternating output across an output winding 32, both windings 30 and 32 being wound to have inductive relationship with each other and with the coil 31. The A-C output of the oscillator circuit developed across winding 32 undergoes full-wave rectification by a pair of diodes 36 and 37 with the resulting output smoothed by a capacitor 38. The transistor 34 receives positive bias through a resistor 28, negative bias by the winding 30, and is stabilized by a resistor 35. A capacitor 29 provides a bypass circuit for the voltage induced in the winding 30, and the capacitor 27 supplies isolation from minor fluctuations of the positive supply voltage and thus supplies a uniform input to the oscillator of the converter 4.

Referring now to FIGS. 3 and 4, the proximity detector when packaged as indicated has a sensitive area in the region of the coil 5. The remainder of the detector is surrounded by a housing 41 which provides magnetic and electrostatic shielding for the coil 5 and other components of the detector so that the detectors can be mounted adjacent each other or other electrical equipment with negligible interaction. Two mounting holes 44 are mounted in the detector. A four-core cable 43 carries the leads +20, COM, 20, and 26, the cable 43 being attached internally to the detector through a bushing 42. In the event the common line breaks, the output signals at both of the leads 20 and 26 rise to the supply voltage and the control circuits to which the output leads are connected may be designed so as not to respond to a signal of a positive polarity.

The adjusable resistor 9 is mounted as shown so that it may be readily adjusted by turning an adjustment shaft 47 which may be locked in place by a nut 46. The various components shown in the wiring diagram of FIG. 2 are mounted on a printed circuit board 45 which is positioned as shown in FIG. 4.

What is claimed is:

1. A proximity detector comprising two input terminals connectable to a source of unidirectional potential, one side of the source having a given potential of one polarity and the other side having a common or zero potential, an output circuit having two output terminals, a sensing means for sensing the absence or presence of an electrically-conductive object proximate to the sensing means, said sensing means being connected across the two input terminals and supplying a first voltage signal to the output circuit at the same polarity as said given potential, a polarity-reversing means connected across the two input terminals and providing a second voltage signal to the output circuit at opposite polarity to said given potential, said output circuit responding to the first and second voltage signals to provide output signals of opposite polarity to the given potential at the two output terminals.

2. A proximity detector as claimed in claim 1 wherein the output circuit comprises a bistable multivibrator including a first and a second transistor and having two stable states of operation corresponding respectively to the signals at the two output terminals, one stable state, indicative of the absence of the object, producing an output signal at one of the two output terminals as a result of non-conduction of the first transistor and conduction of the second transistor, and the other stable state, indicative of the presence of the object, producing an output signal at the other of said two output terminals as a result of conduction of the first transistor and the non-conduction of the second transistor.

3. A proximity detector as claimed in claim 1 wherein the output circuit comprises a bistable multivibrator including a first and a second transistor, a base of the first transistor is connected to receive said first voltage signal from the sensing means through a first bias resistor and to receive said second voltage signal from the polarity-reversing means through a second bias resistor, a collector of the first transistor is connected to receive said second voltage signal from the polarity-reversing means through a first collector load resistor, and a base of the second transistor is connected to the collector of the first transistor through a third bias resistor and to the common potential through a fourth bias resistor, a collector of the second transistor is connected to receive said second voltage signal from the polarity-reversing means through a second collector load resistor and is connected to the base of the first transistor through a feedback resistor, one of the two output terminals being connected to the collector of the second transistor and having an output signal indicative of the absence of the object, and the other output terminal being connected to the collector of the first transistor and having an output signal indicative of the presence of the object.

4. A proximity detector as claimed in claim 1 wherein the sensing means comprises an L-C parallel-tuned oscillating tank circuit comprising a coil and a capacitor, an amplifier, and a means for feeding an adjustable feedback voltage from the amplifier to the tank circuit, the coil of the tank circuit providing a magnetic field which senses by distortion thereof the penetration of the object into the field.

5. A proximity detector as claimed in claim 1 wherein the polarity-reversing means comprises an amplifier including a transistor having a collector, an emitter, and a base, an L-C parallel-tuned oscillating tank circuit including a coil and a capacitor, said tank circuit being connected between the input terminal connectable to said one side of the source and the collector of the transistor, thereby providing a collector load reactance for the transistor, and the emitter of the transistor being connected to the other input terminal, a biasing circuit connected to the base of the transistor through a first winding which is in inductive relation to the coil, a second winding inductively coupled to the coil and the first winding and providing at its terminals an output voltage derived from the coil, a full-wave rectifier for rectifying the voltage at the terminals of the second winding thereby to provide said second voltage signal, and means for impressing said second voltage singal on said output circuit.

6. A proximity detector as claimed in claim 1 wherein the first voltage signal to the output circuit is rectified and smoothed by a detector connected between the sensing means and the output circuit.

7. A proximity detector as claimed in claim 6 wherein the detector comprises a pi-network of components having two leg branches and a bridge portion, a D-C restoring resistor interposed in one leg branch and connected across the sensing means to receive said first voltage signal, a diode interposed in the bridge portion and providing by rectification a unidirectional potential at the same polarity as the given potential and related in magnitude to said first voltage signal, and a capacitor connected in the other leg branch for smoothing the unidirectional potential at the diode, and means supplying the unidirectional potential to the output circuit.

8. A proximity detector as claimed in claim 4 wherein the coil of the sensing means is mounted internally adjacent a wall of a housing enclosing the proximity detector to provide a sensitive area externally adjacent the wall of the housing, which area is permeated by lines of flux comprising the magnetic field of the coil, and the means for feeding an adjustable feedback voltage to the tank circuit includes an adjustable resistor, the adjustable resistor being adjustable externally of the housing by means of a shaft which extends therefrom.

References Cited

UNITED STATES PATENTS

| | | | |
|---|---|---|---|
| 3,027,467 | 3/1962 | Lipman ___________ | 324—41 X |
| 3,197,658 | 7/1965 | Byrnes et al. ______ | 324—41 X |

ROY LAKE, Primary Examiner

S. H. GRIMM, Assistant Examiner

U.S. Cl. X.R.

331—112, 117, 182; 321—2; 324—41; 340—258